Oct. 26, 1965 T. MOLLINGA 3,214,706

WIDE BAND AMPLIFIER WITH ADJUSTABLE D.C. OUTPUT LEVEL

Filed Jan. 9, 1962

INVENTOR.
THOMAS MOLLINGA
BY Christie, Parker & Hale
ATTORNEYS.

3,214,706

WIDE BAND AMPLIFIER WITH ADJUSTABLE D.C. OUTPUT LEVEL

Thomas Mollinga, Sierra Madre, Calif., assignor to Burroughs Corporation, Detroit, Mich., a corporation of Michigan Filed Jan. 9, 1962, Ser. No. 165,177
1 Claim. (Cl. 330—22)

This invention relates to a novel electrical circuit for changing the direct current signal level of alternating current and pulse signals.

Electronic devices, as well as the individual stages thereof, generally operate at different direct current signal levels. Therefore to couple a signal from one device to another or from a first to a second stage without distorting the signal requires the use of a separate electrical coupling device. The coupling device, which may be termed a signal level converter, is coupled between the devices or stages thereof and functions, for example, to convert the direct current signal level of the signal from that of the first stage to that of the second stage without distorting the waveform of the signal.

In the past, signal level converters have either possessed a rather limited frequency range of distortion-free operation or have been highly temperature sensitive in addition to requiring high current signals for operation.

In contrast to the conventional signal level converters, the present invention is adjustable to convert the direct current signal level of alternating current and pulse signals over a wide range of values without requiring special selection of components. The signal level converter is relatively temperature insensitive and operates over a wide range of frequencies (D.C. to 30 mc.) on small current signals.

Briefly, the above signal level converter, in a basic form, comprises a normally conducting input transistor coupled to receive input signals at its base terminal. Connected to the emitter of the input transistor is a potentiometer having its variable arm coupled to an output transistor. The output transistor is normally conducting and is arranged in an emitter follower configuration to supply an output signal at its emitter terminal. Coupled to the remaining terminal of the potentiometer is a constant current generator.

Current from the current generator flows through the potentiometer to produce a constant voltage thereacross. Any change in the input voltage applied to the input transistor causes the same voltage change at any point along the potentiometer. Thus, the variable arm of the potentiometer may be adjusted to any direct current voltage level to produce an output signal at the output terminal which is an exact replica of the input signal displaced in magnitude by a direct current voltage level determined by the position of the adjustable arm.

Figure 2:
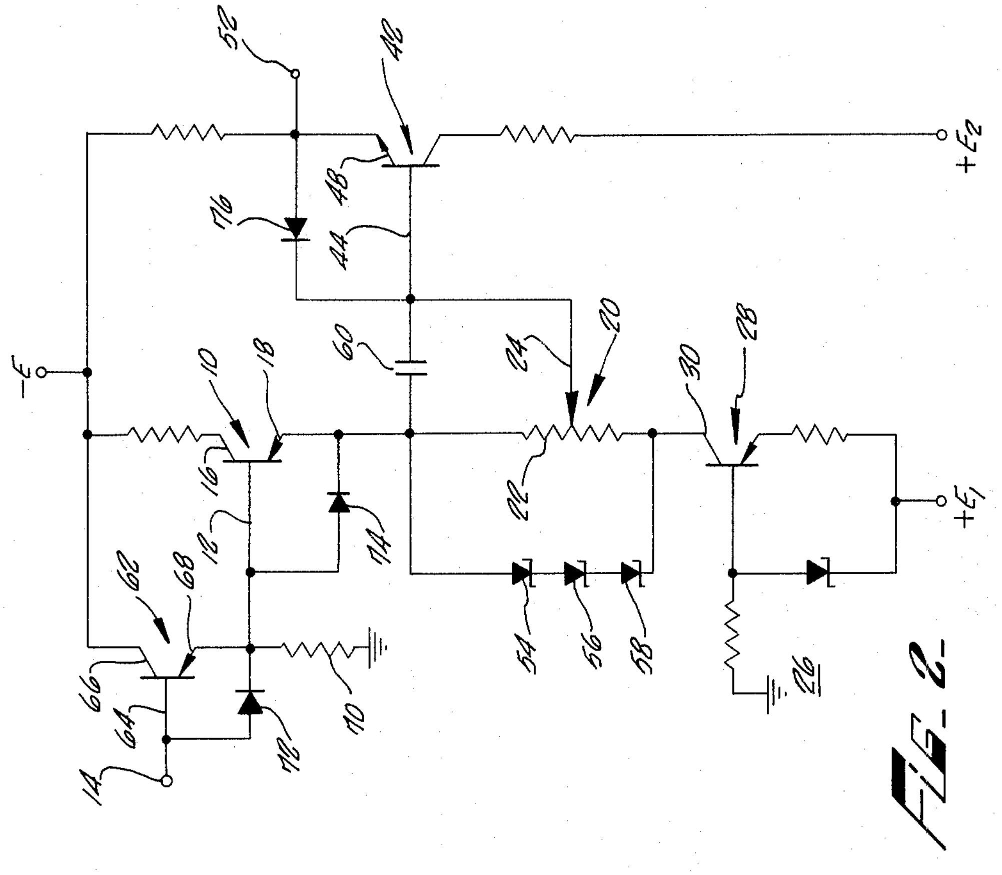
Figure 1:
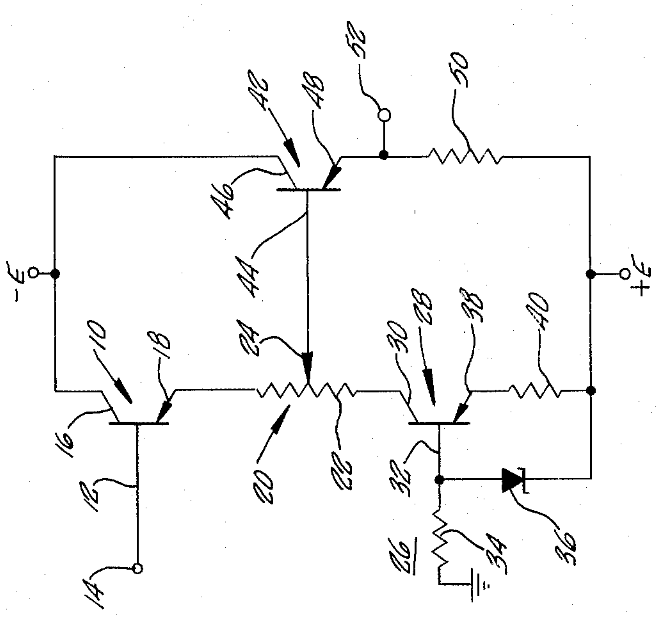

The above as well as other features of the present invention may be more clearly understood by reference to the following detailed description when considered with the drawings, in which:

FIGURE 1 is a schematic representation of a basic form of the signal level converter of the present invention; and FIGURE 2 is a schematic representation of a preferred form of the signal level converter of the present invention.

As represented in FIGURE 1, the basic form of the signal level converter of the present invention includes an input transistor 10 having a base terminal 12 which is coupled to an input terminal 14, a collector terminal 16 coupled to a source of negative potential —E, and an emitter terminal 18.

The emitter terminal 18 of the transistor 10 is coupled to a potentiometer represented generally at 20. The potentiometer 20, by way of example, is illustrated as including a resistor 22 and a movable arm 24. The resistor 22 is coupled between the emitter terminal 18 and a constant current generator represented generally at 26.

The constant current generator 26 includes a transistor 28 having its collector terminal 30 coupled to the resistor 22, a base terminal 32 coupled through a resistor 34 to ground and through a zener diode 36 to a source of positive potential +E, and an emitter terminal 38 coupled though a biasing resistor 40 also to the source of positive potential +E.

The zener diode 36 functions to fix the potential across the resistor 40. Thus, a constant current flows from the source of positive potential through the resistor 40 and the emitter-collector circuit of the transistor 28 to the potentiometer 20. Since a constant current flows through the potentiometer 20 a constant voltage drop is developed thereacross, i.e., between the collector 30 of the transistor 28 and the emitter 18 of the transistor 10. Thus, the voltage between the emitter 18 and the movable arm 24 may be varied in a linear fashion by movement of the movable arm 24 along the resistor 22.

By the coupling of the potentiometer 20 and the constant current generator 26 in series with the emitter 18 of the transistor 10, the transistor 10 is biased to a normally conductive state and functions as an emitter follower. The transistor 10 thus possesses a high input impedance and a low output impedance and voltage changes occurring at the input terminal 14 produce like voltage changes at the emitter terminal 18.

Coupled to the movable arm 24 is an output transistor 42. The output transistor 42 includes a base terminal 44 coupled to the movable arm 24, a collector terminal 46 coupled to the source of negative potential —E and an emitter terminal 48 coupled through a biasing resistor 50 to the source of positive potential +E. Coupled to the emitter terminal 48 is an output terminal 52. Due to the source of positive potential and the biasing resistor 50 the transistor 42 is normally biased to a conductive state.

The transistor 42, as described above, is arranged in an emitter follower configuration. Thus a change in potential at the base terminal 44 produces a like change in potential at the emitter terminal 48 and hence at the output terminal 52. Accordingly, changes in the potential occurring at the adjustable arm 24 produce like changes in the potential appearing at the output terminal 52.

Since the input and output transistors 10 and 42 are both arranged in an emitter follower configuration, the signal level converter of the present invention possesses a high input impedance and a low output impedance. Thus the signal level converter has a minimal loading effect on the electronic devices or stages coupled thereto.

Considering now the overall operation of the basic form of the present invention the adjustable arm 24 of the potentiometer 20 is set at a point along the resistor 22 to provide a predetermined direct current signal level conversion between the input terminal 14 and the arm 24. A change in potential at the input terminal 14 in response to an input signal then produces a like change in the potential appearing at the emitter terminal 18 of the transistor 10. Since a constant potential is maintained across the resistor 22 the change in potential at the emitter 18 produces a like change in potential at each point along the resistor 22. Accordingly, the change in potential at the input terminal 14 results in a like change in potential at the movable arm 24. The potential appearing at the adjustable arm 24 is then reflected at the output terminal 52. The output signal thus developed is an exact replica of the input signal shifted in direct current signal level by a magnitude determined by the position of the adjustable arm 24 along the resistor 22.

To improve the range of distortion-free operation as well as the high frequency signal response of the basic signal level converter of the present invention, the basic circuit of FIGURE 1 may be modified as illustrated in FIGURE 2. In particular, means may be included between the emitter 18 of the transistor 10 and the collector 30 of transistor 28 to maintain the junction of the resistor 22 and the collector 30 at a low impedance thereby correcting for any losses which may have occurred along the resistor 22 due to the finite nature of the output impedance of the constant current generator 26. By way of example only, the above means includes three zener diodes 54, 56 and 58 coupled in series, the anode of the zener diode 54 being coupled to the emitter 18 and the cathode of the zener diode 58 being coupled to the collector 30. By way of example, the zener diodes may have a reverse breakdown voltage of 6 volts. The voltage developed across the resistor 22 is thus limited to 18 volts and movement of the movable arm 24 along the resistor 22 from between the emitter 18 and the collector 30 varies the direct current signal level of the output signals from substantially 0 to substantially 18 volts in a linear fashion.

To further maintain the amplitude of the ouput signal at high frequencies a capacitor 60 is coupled between the emitter 18 of the transistor 10 and the adjustable arm 24 of the potentiometer 20. As the frequency of the input signal applied to the input terminal 14 increases causing the output impedance of the generator 26 to decrease, the capacitor 60 effects a reduction in the impedance between the adjustable arm 24 and the emitter 18 of the transistor 10. In this manner the equality of amplitudes of the input signal and the signal developed at the adjustable arm 24 is maintained at high frequency.

In order to reduce loading of preceding stages due to the reduction of the input impedance of an emitter follower stage with increasing frequency the preferred form of the present invention includes an additional emitter follower stage including a transistor 62 coupled in series with the transistor 10. In particular, the transistor 62 includes a base terminal 64 coupled to the input terminal 14, a collector terminal 66 coupled to the source of negative potential —E, and an emitter terminal 68 coupled to the base 12 of the transistor 10 and to ground through a biasing resistor 70. By a combination of the two emitter followers, including the transistors 62 and 10 connected in series, the input impedance of the signal level converter of the present invention is substantially doubled and the loading at high frequencies of the stage coupled to the input terminal 14 substantially reduced.

To improve the response time of the signal level converter of the present invention the improved form thereof illustrated in FIGURE 2 includes a plurality of diodes 72, 74 and 76. The anode of the diode 72 is coupled to the base 64 and the cathode of the diode to the emitter 68 of the transistor 62. The diodes 74 and 76 are coupled in a like manner to the transistors 10 and 42, respectively. The diodes 72, 74 and 76 provide a rapid discharge path for any stray capacitance associated with the emitters 68, 18 and 48, respectively. Since the voltage developed across any stray capacitance between the emitter 68 and ground cannot change instantaneously a fast positive-going input signal applied to the input terminal 14 may cut off the transistor 62. Normally, an appreciable time is required for the stray capacitance to discharge through the resistor 70. However, due to the diode 72, when a positive input signal is applied to the input terminal 14 the diode 72 is immediately forward biased to provide a discharging path for the stray capacitance. Thus, the waveform of the input signal applied to the input terminal 14 is accurately reproduced at the emitter terminal 68. A similar function is performed by the diodes 74 and 76 associated with the transistors 10 and 42, respectively.

It is to be noted that the output transistor 42, in a preferred embodiment of the present invention illustrated in FIGURE 2, is of an NPN type while the transistors 10 and 62 are of a PNP type. This complementary arrangement provides means for compensating for the emitter-base drop inherent in transistors. Thus, an emitter to base drop occurs across the transistors 10 and 62 in a first direction while an emitter to base drop occurs across the transistor 42 but in an opposite direction. Thus, considering the overall drop between the input terminal 14 and the output terminal 52, the emitter to base drop across the transistor 42 tends to compensate for the emitter to base drop occurring across the transistors 10 and 62. This aids in developing an exact replica of the input signal at the output terminal 52 only displaced in magnitude by a direct current signal level determined by the position of the adjustable arm 24.

Similar to the basic form of the present invention illustrated in FIGURE 1, the preferred form of the signal level converter also possesses a high input impedance, due to the emitter follower configuration including the transistor 62, and a low output impedance, due to the emitter follower configuration including the transistor 42. Thus, the signal level converter of the present invention has a minimal effect on any electrical stage coupled to the input terminal 14 and provides a low impedance source to any electrical stage coupled to the output terminal 52. Accordingly, a high speed signal level conversion is produced between the input terminal 14 and the output terminal 52 with a minimum of effect upon the circuitry coupled thereto.

What is claimed is:

A signal level converter comprising:

a first transistor;

means coupled to the first transistor for biasing the first transistor to a normally conductive state;

a second transistor arranged in an emitter follower configuration;

a plurality of diodes, one coupled between the base and emitter of each of the transistors to provide a discharge path for any stray capacitance associated with the transistors;

means coupled to the second transistor for biasing the second transistor to a normally conductive state;

a constant current generator;

a potentiometer coupled between the emitter of the first transistor and the constant current generator and having its variable arm coupled to the base of the second transistor;

and a zener diode shunting the potentiometer having its anode coupled to the emitter of the first transistor and its cathode coupled to the constant current generator.

References Cited by the Examiner

UNITED STATES PATENTS

| | | | |
|---|---|---|---|
| 2,895,017 | 7/59 | Klipper | 330—70 X |
| 2,939,018 | 5/60 | Faulkner. | |
| 2,939,087 | 5/60 | Doyle | 330—70 |
| 2,963,656 | 12/60 | Parris | 330—19 X |
| 3,042,019 | 7/64 | Favin | 330—19 X |

ROY LAKE, *Primary Examiner.*

NATHAN KAUFMAN, *Examiner.*